(12) United States Patent
Stewart et al.

(10) Patent No.: US 7,443,711 B1
(45) Date of Patent: Oct. 28, 2008

(54) NON-VOLATILE PROGRAMMABLE IMPEDANCE NANOSCALE DEVICES

(75) Inventors: Duncan R. Stewart, Menlo Park, CA (US); Patricia A. Beck, Palo Alto, CA (US); Douglas A. Ohlberg, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 21 days.

(21) Appl. No.: 11/014,554

(22) Filed: Dec. 16, 2004

(51) Int. Cl.
*G11C 11/56* (2006.01)
*H01L 23/58* (2006.01)
(52) U.S. Cl. .................................. 365/148; 257/2; 257/5
(58) Field of Classification Search ................. 365/148; 257/2, 5
See application file for complete search history.

(56) References Cited

U.S. PATENT DOCUMENTS

| | | | |
|---|---|---|---|
| 4,646,266 A * | 2/1987 | Ovshinsky et al. | 365/105 |
| 6,055,180 A * | 4/2000 | Gudesen et al. | 365/175 |
| 6,128,214 A | 10/2000 | Kuekes et al. | |
| 6,256,767 B1 | 7/2001 | Kuekes et al. | |
| 6,314,019 B1 | 11/2001 | Kuekes et al. | |
| 6,426,891 B1 * | 7/2002 | Katori | 365/175 |
| 6,458,621 B1 | 10/2002 | Beck | |
| 6,459,095 B1 | 10/2002 | Heath et al. | |
| 6,559,468 B1 | 5/2003 | Kuekes et al. | |
| 6,579,760 B1 * | 6/2003 | Lung | 438/257 |
| 6,707,063 B2 | 3/2004 | Chen | |
| 2001/0054709 A1 | 12/2001 | Heath et al. | |
| 2003/0226996 A1 | 12/2003 | Aramaki et al. | |
| 2004/0057323 A1 | 3/2004 | Tanabe | |
| 2004/0195688 A1 | 10/2004 | Beck et al. | |

OTHER PUBLICATIONS

Chabinyc et al., "Molecular Rectification in a Metal-Insulator-Metal Junction Based on Self-Assembled Monolayers," J. Am. Chem. Soc. 2002, 124, 11730-11736.
Chang et al., "Investigation of a model molecular-electronic rectifier with an evaporated Ti-metal top contact," Applied Physics Letters, vol. 83, No. 15, Oct. 13, 2003, pp. 3198-3200.
Chen et al., "Large On-Off Ratios and Negative Differential Resistance in a Molecular Electronic Device," Science, Nov. 19, 1999, vol. 286, pp. 1550-1552.
Chen et al., "Nanoscale molecular-switch devices fabricated by imprint lithography," Applied Physics Letters, vol. 82, No. 10, Mar. 10, 2003.
Collier et al., "A[2]Catenane-Based Solid State Electronically Reconfigurable Switch," Science, Aug. 18, 2000, vol. 289, pp. 1172-1175.
Collier et al., "Electronically Configurable Molecular-Based Logic Gates," Science, vol. 285, Jul. 16, 1999, pp. 391-394.
Stewart et al., "Molecule-Independent Electrical Swtiching in Pt/Organic Monolayer/Ti Devices," Nano Letters, 2004, vol. 4, No. 1, 133-136.

* cited by examiner

*Primary Examiner*—Evan Pert

(57) ABSTRACT

Programmable impedance devices and methods of fabricating the devices are disclosed. The programmable impedance devices exhibit non-volatile tunable impedance properties. A programmable impedance device includes a first electrode, a second electrode and a programmable material disposed between the two electrodes. The programmable material may be disposed at a junction between the first and second electrodes.

30 Claims, 7 Drawing Sheets

NON-VOLATILE PROGRAMMABLE IMPEDANCE NANOSCALE DEVICES

CONTRACTUAL ORIGIN OF THE INVENTION

This invention was made with United States Government support under Contract No. DABT63-99-3-003 awarded by the Defense Advanced Research Projects Agency (DARPA). The United States Government has certain rights in the invention.

FIELD OF THE INVENTION

The present invention relates generally to nanometer-scale electronic devices (nanoelectronics), molecular electronics and more particularly to electronic devices exhibiting non-volatile programmable impedance characteristics.

BACKGROUND OF THE INVENTION

Electronic devices exhibiting a specific electrical impedance that may also be tuned to various impedance values while part of an electronic circuit are very useful in a variety of applications. Traditional semiconductor fabrication techniques allow fabrication of devices exhibiting a single non-volatile impedance or, in the case of a conventional transistor, a configurable, but volatile impedance. These single impedance devices may be tuned to various impedance values using a variety of techniques such as mask modification programming, laser trimming, or programming of a non-volatile device (e.g., fuses, anti-fuses, and flash memory). Unfortunately, many of these techniques tend to be irreversible. In other words, the impedance value may be changed to a new desired stable state, but once changed, it cannot be changed back to another desired stable state. Other techniques, which may be reversible, involve logically combining a variety of fixed-value impedance devices in parallel and/or in series to arrive at the total desired impedance. To maintain large dynamic range without loss of sensitivity, a large number of impedance devices may be required in parallel and/or in series to achieve the desired impedance value. This combination of multiple impedance devices creates added complexity and may consume large amounts of area on an electronic device.

Additionally, semiconductor device fabrication is becoming increasingly complex and difficult as attempts are made to reduce device size to the nanometer technology range. A new fabrication and device formation plan involving relatively loose tolerances and self-assembly of sub-elements may be required to fully achieve the goal of useable electronic circuits incorporating nanometer-scale devices.

Recent research and development in the fields of nanoelectronics and molecular electronics has included several reports of molecular electronic devices comprised of two electrodes with a molecular compound disposed between the two electrodes. These reported devices have the characteristics of non-volatile configurable switches, wherein a bias may be applied to the molecular electronic device in such a manner as to cause the device to appear substantially like an open switch (i.e. a very high resistance) or substantially like a closed switch (i.e. a very low resistance). While two discrete states may be sufficient and desirable for some memory or logic applications, this approach is limited. Other digital circuits require more than two discrete states and analog applications require a continuum of impedance variations. Two-state devices also do not facilitate impedance matching, such as for high speed signal applications.

A highly controllable non-volatile device, which exhibits a programmable impedance behavior and that may be fabricated down to nanometer dimensions, where one or more dimensions are nanometer-scale, may be valuable in a wide variety of electronic applications. Further, a device that is reconfigurable throughout a range of impedance values may be valuable in fault tolerant systems, which are becoming increasingly important both at nanometer-scale and micron-scale applications.

BRIEF SUMMARY OF THE INVENTION

The present invention, in a number of embodiments, includes a programmable impedance device having a non-volatile programmable impedance, which may be reconfigured to solve many of the problems described above. In one embodiment of the invention, a programmable impedance device includes a first electrode, a second electrode and a programmable material disposed between the first and second electrodes. The first and second electrodes may be disposed to at least partially overlap such that a junction is formed between the first and second electrodes. The programmable material may be disposed at least at the junction to operably couple the first and second electrodes such that the programmable impedance device exhibits a non-volatile programmable impedance property. Another embodiment of the present invention is a method of fabricating at least one programmable impedance device. This method comprises forming a first electrode over a substrate and forming a second electrode over the substrate such that the second electrode at least partially overlaps the first electrode to form a junction at the overlap. The method also includes, forming a programmable material such that it is disposed at the junction between the first electrode and the second electrode and electrically couples the first electrode and the second electrode with a non-volatile programmable impedance.

Another embodiment of the present invention is a method of tuning the programmable impedance device. This tuning method includes applying at least one current pulse between the pair of electrodes in a first bias direction, with an absolute value peak current, wherein each current pulse is sufficient to modify the impedance between the pair of electrodes by an impedance decrease associated with the absolute value peak current.

Another embodiment, drawn to a method of tuning the programmable impedance device, includes applying at least one voltage pulse between the pair of electrodes in a second bias direction with an absolute value peak voltage, wherein each voltage pulse is sufficient to modify an impedance between the pair of electrodes by an impedance increase associated with the absolute value peak voltage.

Another embodiment, drawn to a method of tuning the programmable impedance device, includes applying at least one voltage pulse between the pair of electrodes in a first bias direction, with an absolute value peak voltage, wherein each voltage pulse is sufficient to modify the impedance between the pair of electrodes by an impedance decrease associated with the absolute value peak voltage.

Another embodiment, drawn to a method of tuning the programmable impedance device, includes applying at least one current pulse between the pair of electrodes in a second bias direction with an absolute value peak current, wherein the current pulse is sufficient to modify an impedance between the pair of electrodes by an impedance increase associated with the absolute value peak current.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

In the following description, micron-scale dimensions refer roughly to dimensions that range from one micrometer up to a few micrometers, sub-micron scale dimensions refer roughly to dimensions that range from 1 micrometer down to 0.05 micrometers, and nanometer scale dimensions refer roughly to dimensions that range from 1 nanometer up to 50 nanometers (0.05 micrometers).

Figure 1:
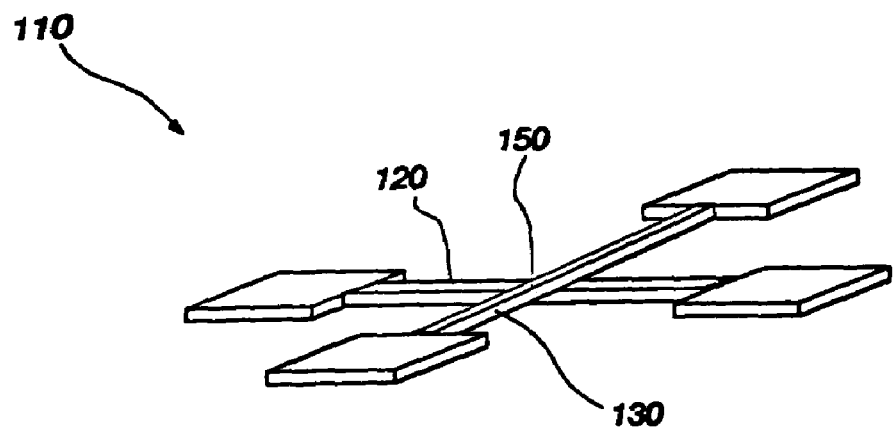
FIG. 1 is a three dimensional view of a programmable impedance device according to an embodiment of the present invention.
Figure 2:
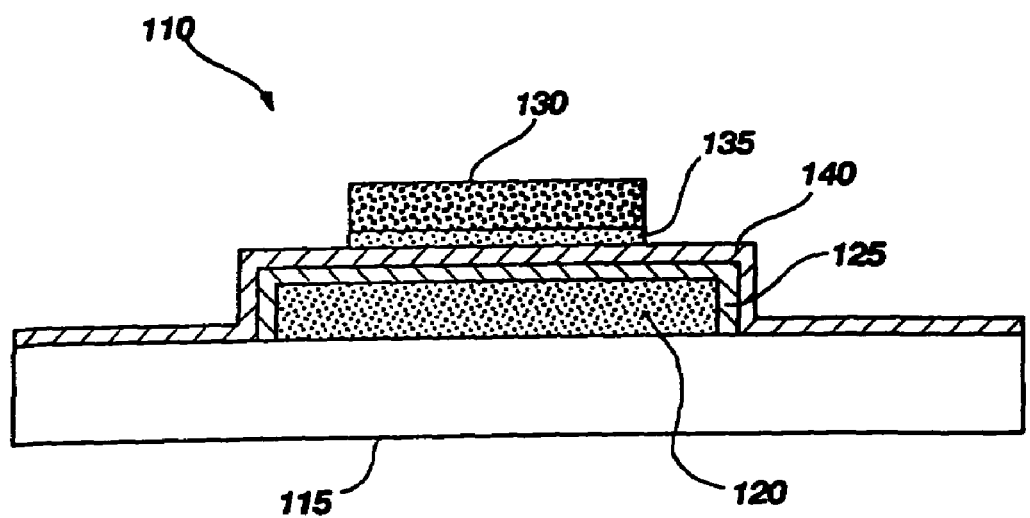
FIG. 2 is a cross-sectional view of the programmable impedance device according to an embodiment of the present invention.

A programmable impedance device 110 according to an embodiment of the present invention, using crossed rectangular electrodes, is shown in FIGS. 1 and 2. The programmable impedance device 110 includes a first electrode 120 disposed on a substrate 115 in a first direction, a programmable material 140 disposed over at least a portion of the first electrode 120 and a second electrode 130 disposed over the programmable material 140 at a non-zero angle relative to the first electrode 120.

The programmable impedance device 110 may be formed on a variety of suitable insulating, or semiconducting substrates 115, such as, for example; a suitable plastic; silicon; silicon on insulator (SOI), glass, silicon oxide, sapphire; gallium arsenide; indium phosphide; or other semiconductor with or without an additional oxide or nitride coating. As used herein, the term substrate 115 includes and encompasses all such substrates.

Additionally, the programmable impedance devices 110 may be processed as additional layers on a semiconductor wafer where processing includes a conventional metal oxide semiconductor (MOS) process or a conventional bipolar process. The programmable impedance devices 110 may be fabricated on silicon dioxide. As a result, conventional MOS devices may be processed on a semiconductor wafer followed by a dielectric layer, such as silicon dioxide, silicon nitride, or silicon carbide. Vias may be formed through the dielectric to couple conventional MOS devices to programmable impedance devices 110. Then, the programmable impedance devices 110 may be formed on the dielectric to couple to the conventional MOS devices. Similar methods may be used to couple the programmable impedance devices to photonic devices, which are typically formed on group III-V materials, such as, for example, gallium arsenide, and indium phosphide.

In one embodiment of the invention, the first electrode 120 comprises platinum and the second electrode 130 comprises titanium. Experimentation has shown that these metals, in combination with a wide variety of programmable materials 140, create an asymmetric electrode sandwich, which may exhibit switching and well-controlled non-volatile programmable impedance properties described below.

Figure 3:
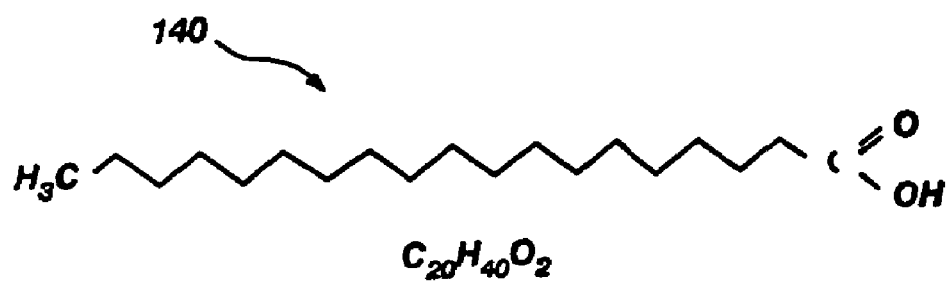
FIG. 3 illustrates an exemplary programmable material suitable for use in the present invention.

A wide variety of programmable materials 140 may be useful in practicing the present invention. FIG. 3 illustrates eicosanoic acid ($C_{19}H_{39}COOH$) as an exemplary material that may be used as the programmable material. Eicosanoic acid is used for most discussion purposes for clarity and because it forms well characterized, highly ordered, Langmuir-Blodgett films and has been shown to have insulative properties. Some other exemplary programmable materials are; stearic acid ($C_{17}H_{35}COOH$), poly (methyl methacrylate) often abbreviated as PMMA, and tantalum oxide $Ta_2O_5$. In addition, a class of rotaxane or pseudo-rotaxane molecules may be useful as programmable materials. Furthermore, in some embodiments, the programmable material may comprise one or more elements either layered, intermixed homogenously, or intermixed inhomogenqusly. For example, the programmable material may include a first interface element 125 and a second interface element 135. These interface elements 125 and 135 are explained more fully below.

In fabricating the programmable impedance device, a layer comprising first electrodes 120 may be formed on a suitable substrate 115, using conventional deposition and patterning technology, such as, for example, sputter deposition, evaporation, and vapor deposition techniques and lithographic techniques including optical, ultraviolet, and electron beam techniques. Electrodes formed with conventional semiconductor techniques generally may have a somewhat rectangular cross section, although trapezoidal, circular, and rounded cross sections and combinations of the foregoing are not precluded. In addition, the first electrodes 120 may be formed by known techniques, such as, for example, chemically prepared metal nanowires and chemically prepared semiconductor nanowires. In a tested embodiment, the first electrodes 120 were formed with a platinum layer of about 100 nm thickness using conventional optical lithographic techniques. Some other exemplary materials for the first electrodes are aluminum, silicon, and tungsten.

In some embodiments, it may be desirable to tailor the surface of the first electrodes 120 following deposition. For example, it may be desirable to perform planarization or smoothing processes. In addition, it may be desirable to form a nano-textured topography, or chemical species functionalization. These processes may create a smoother surface on the first electrodes 120 and reduce the possible distinct height transitions between the substrate 115 and the first electrodes 120. Furthermore, this tailoring process may enhance deposition results for the programmable material 140 or first interface element 125. Exemplary tailoring processes are described in U.S. patent application Ser. No. 10/405,294, entitled "Custom Electrodes for Molecular Memory and Logic Devices," and incorporated herein by reference.

If desired, a first interface element 125 may be formed between the first electrodes 120 and the programmable material 140. This interface element 125 may enhance the operable coupling between the first electrodes 120 and the programmable material 140 and may enhance the programmable characteristics of the programmable impedance device 110. Some of this enhancement may result from the interface element 125 forming a tunnel barrier between the first electrodes 120 and the programmable material 140. For example, and not by way of limitation, an oxide layer may be developed on the first electrodes 120. One such interface element 125 that has been fabricated comprises a thin layer of platinum oxide over platinum first electrodes 120. Other suitable interface elements include titanium oxide and titanium carbide.

Programmable material may be deposited over all or part of the substrate 115, first electrodes 120, and, if present, first interface element 125, using material deposition methods that create a high degree of molecular anisotropy in a monolayer of the programmable material 140. Some example deposition methods include; vapor deposition, self-assembled monolayers (SAM), and Langmuir-Blodgett (LB) film deposition techniques. LB film deposition, which was used in fabricating some exemplary embodiments, conventionally involves the process of creating a monolayer of a molecular compound on the surface of water or other suitable liquid. The monolayer may then be transferred to the surface of a substrate 115 by pulling the substrate through the monolayer-covered liquid. Additional monolayers may be added by repeatedly immersing and removing the substrate 115 through the monolayer-covered liquid. This technique produces a uniform coating of the programmable material 140 on the substrate 115 and over the first electrodes 120. Some embodiments of the invention may use a single monolayer. Other embodiments of the invention may use a plurality of monolayers.

Similar to the interface between the first electrodes 120 and the programmable material 140, a second interface element 135 may be formed between the programmable material 140 and the second electrodes 130. As explained above for the first interface element 125, the second interface element 135 may enhance the operable coupling between the programmable material 140 the second electrodes 130 and may enhance the programmable characteristics of the programmable impedance device 110. Exemplary second interface element 135 materials are the same as those outlined above for the first interface element 125.

A layer of second electrodes 130 may be deposited over the programmable material 140, or second interface element 135, to complete formation of the programmable impedance device 110. The second electrodes 130, as well as the first electrodes 130, may be comprised of a conductive material that may have at least a small amount of reactivity with the adjoining programmable material 140. Some example conductive materials that have been tested are titanium, aluminum, chromium, and platinum. Many different deposition techniques may be used to place the layer of second electrodes 130 on the programmable material 140, such as, conventional photolithography deposition/etching techniques, imprinting, and nanotechnology techniques (such as nanowires formation) described for the formation of the first electrodes 120. The deposition technique for the second electrodes 130 should be a technique that does not unduly damage the deposited film of programmable material 140.

In one tested exemplary embodiment, the second electrodes 130 of titanium were evaporated onto the organic film through a shadow mask to a thickness of about 5 nm. An aluminum layer (thickness of approximately 200 nm) was then deposited on the titanium layer through the shadow mask without breaking vacuum.

Programmable material not sandwiched between the two electrode layers at junctions 150 of the electrodes may be considered excess programmable material. In some embodiments, excess programmable material may be removed after deposition of the second electrodes 130. In other embodiments, the excess programmable material may be left in place.

A programmable impedance device 110, as illustrated in FIG. 1, may be formed anywhere that a first electrode 120 and second electrode 130 cross with a layer of programmable material 140 between the pair of electrodes (120 and 130). As a result, the electrode crossings do not need to be perpendicular. In fact, they may be oriented at any non-zero angle. Furthermore, while FIG. 1, illustrates the electrodes (120 and 130) configured as crossed electrodes, many other configurations are contemplated within the scope of the invention. For example, and not by way of limitation, the first and second electrodes (120 and 130) may be disposed such that the electrodes overlap partially, overlap completely, or approach each other such that there is no full crossing. In addition, the electrodes (120 and 130) may not be long thin lines as illustrated in FIG. 1. For example, and not by way of limitation, they may be shaped as a small circle or an external probe. The electrodes (120 and 130) may also be configured in a variety of cross sectional profiles, such as, for example, the rectangular profile shown, in FIGS. 1 and 2, a trapezoidal profile, a partially circular profile, or a partially ellipsoid profile. Additionally, placement of the layer of second electrodes 130 relative to the underlying layer of first electrodes 120 may include relatively loose tolerances.

The size of the overlapping programmable impedance device 110 formed at the overlap, or junction 150, of the first electrode 120 and the second electrode 130 may vary widely. Exemplary programmable impedance devices 110 have been formed and operated with lateral junction dimensions of about 10 micrometers and with lateral junction dimensions of about 40 nanometers. The non-volatile bistable impedance and non-volatile programmable impedance properties of the present invention should continue to scale down to the nanometer-scale in lateral junction size, enabling many nanoelectronic applications. Device size may be largely a function of component density requirements and compatibility with other devices that may be fabricated on the substrate 115. For example, larger devices may be desirable, for use with conventional semiconductor devices and fabrication techniques. Similarly, smaller devices may be desirable when formed with other nanometer scale structures or processes. Additionally, other combinations of conventional semiconductor devices and nanoscale devices with the present invention are possible.

It will be readily apparent to a person of ordinary skill in the art that the configuration of first electrodes 120 and second electrodes 130 is somewhat arbitrary. The processing steps may be reversed such that the material comprising the second electrodes 130 is formed first and nearest to the substrate 115, while the material comprising the first electrodes 120 is formed last and farthest from the substrate 115.

Figure 4:
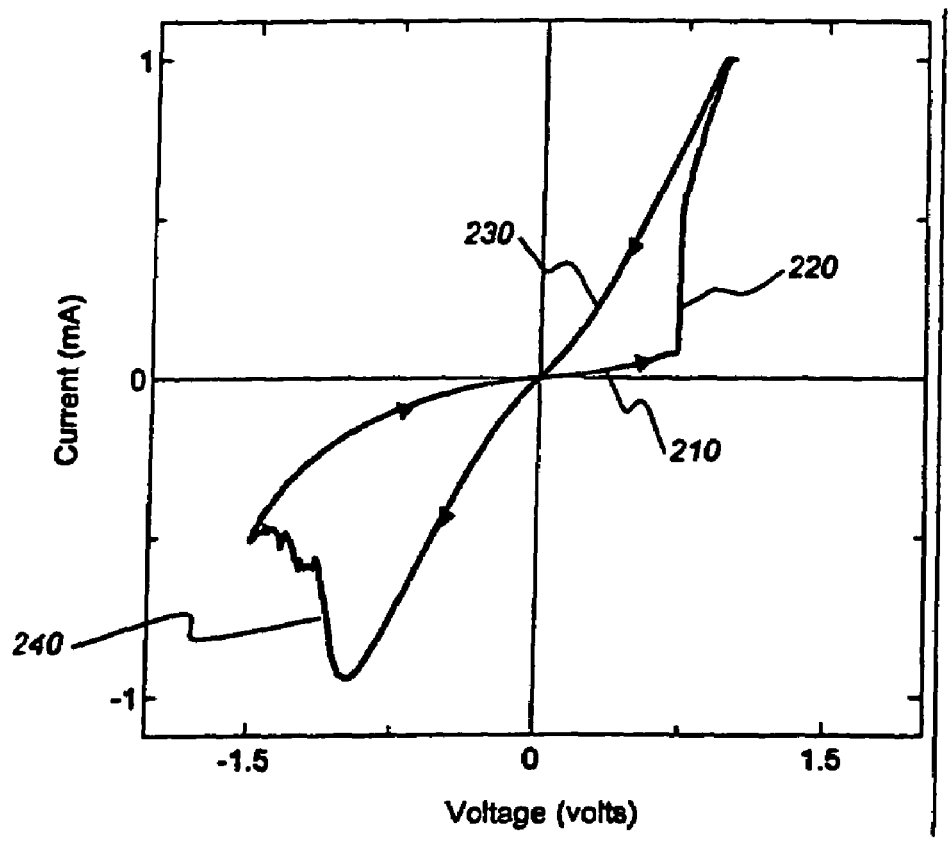
FIG. 4 is a graphic illustration of a hysteretic current voltage characteristic of one embodiment of the present invention.

The programmable impedance devices 110 according to the present invention may be configured to exhibit the properties of a non-volatile bistable impedance and a non-volatile programmable impedance. FIG. 4 illustrates an exemplary non-volatile bistable impedance property in a current vs. voltage (I-V) curve, which shows a hysteresis loop traversed as a "bow tie," as indicated by the arrows. As a first voltage bias (positive in this example) is applied to the programmable impedance device 110, the I-V curve follows a high impedance state 210 to about one volt, where the I-V curve shows an impedance decrease 220 to a low impedance state 230. As the voltage bias is decreased, the I-V curve is indicative of the low impedance state 230. When an opposite voltage bias (negative in this example) is then applied, the I-V curve follows the low impedance state 230 until about 1.5-volts where an impedance increase 240 occurs. As the bias is returned to zero, the I-V curve is indicative of the high impedance state 210.

FIG. 4 is an example of behavior of a possible embodiment of a programmable impedance device 110. The first voltage at which the distinct impedance decrease 220 occurs, as well as the second opposite voltage at which the distinct impedance increase 240 occurs, are somewhat dependent upon the programmable material 140, electrode materials 120 and 130, and interface elements 125 and 135 used in the programmable impedance device 110. For programmable materials 140 and device configurations tested, the impedance decrease 220 has occurred at a positive transition threshold between about 0.5 volts and 1.5 volts, while the impedance increase 240 has occurred at a negative transition threshold between about −0.5 volts and −2.0 volts.

Similarly, impedance values for the low impedance state 230 and high impedance state 210 may vary with different programmable materials 140, electrode materials 120 and 130, and interface elements 125 and 135. For exemplary programmable materials 140 and device configurations tested, the resistive component of the low impedance state 230 has been measured as low as about 250 ohms while the resistive component of the high impedance state 210 has been measured as high as about 40 Mega-ohms.

When small bias voltages below the absolute values of the positive and negative transition thresholds are applied to the programmable impedance devices 110, both the high impedance state 210 and the low impedance state 230, are stable and substantially constant.

Figure 5A:
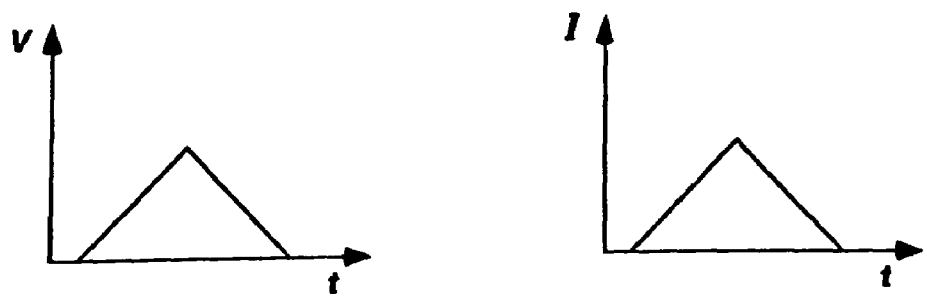
FIGS. 5A, 5B, and 5C are graphs illustrating exemplary voltage pulses and exemplary current pulses, both as a function of time.
Figure 5B:
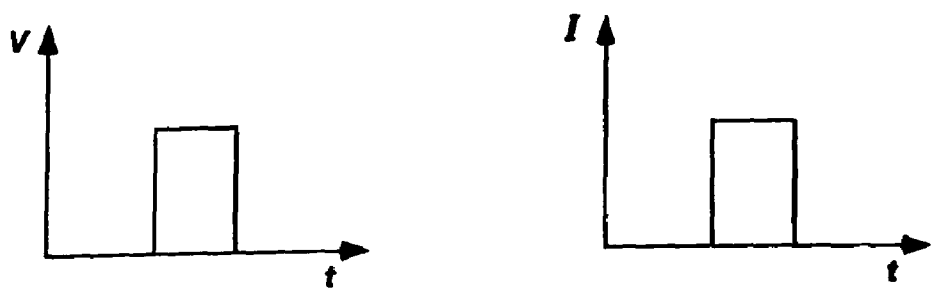
Figure 5C:
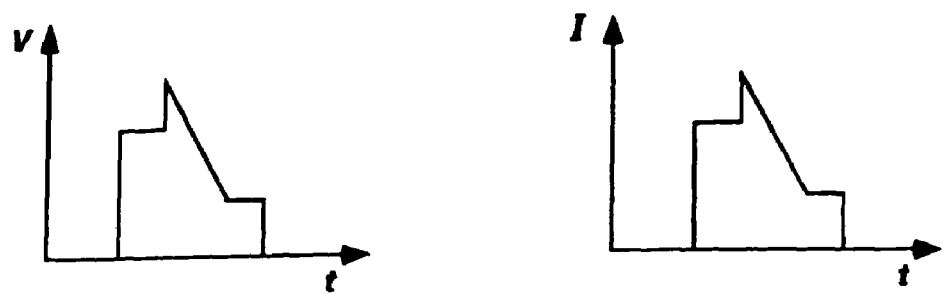

Application of electrical energy to the programmable impedance device 110 is described as "pulses." These pulses may be characterized by observation of a variety of attributes, such as, for example, current, voltage, temperature, or combinations thereof. Herein, pulses are referred to as current pulses and voltage pulses to indicate which attribute is being observed to determine when a specific threshold has been reached. In addition, these pulses may comprise a variety of arbitrary shapes versus time, as illustrated in FIGS. 5A, 5B, and 5C. The illustrated shapes are shown with measurement of both voltage and current attributes. In addition, the illustrated shapes are meant to be exemplary and not limiting.

Figure 6:
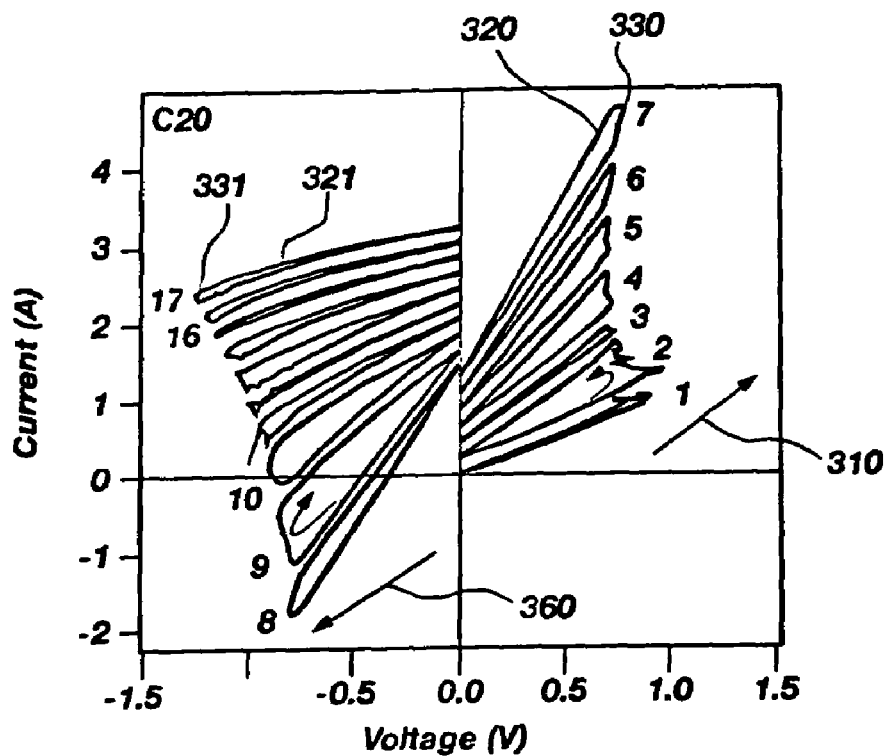
FIG. 6 is a graphic illustration of multiple adjustment processes used for tuning the impedance characteristics of a programmable impedance device according to the present invention.

If the voltage or current is applied in a pulse with an appropriate peak amplitude, each programmable impedance device 110 is continuously tunable between the two extremes of the high impedance state 210 and the low impedance state 230. FIG. 6 illustrates this non-volatile programmable impedance property. In FIG. 6 a series of current-voltage loops are shown and numbered 1 through 17. Each successive loop is displayed on the graph with a 0.2 milliamp (mA) offset from the previous loop, so they can be clearly seen with no overlap. In actuality, each loop begins and ends at zero volts and zero milli-amps.

Loops 1 through 7 are created with triangular current pulses 320 in a first bias direction 310 from zero mA to an absolute value peak current 330, then returning to zero mA. Triangular pulses are schematically illustrated in FIG. 5A.

Loops 8 through 17 are created with triangular voltage pulses 321 in a second bias direction 360 beginning from zero volts to an absolute value peak voltage 331, and then returning to zero volts. As shown by the arrows within loop 2 and loop 9, each positive current-voltage loop 320 is traversed in a counter-clockwise sense, while each negative current-voltage loop 321 is traversed in a clockwise sense. Positive and negative values related to the bias directions are somewhat arbitrary. In this description, the bias pulses are applied with the power source being applied to the second electrode 130, while the first electrode 120 is grounded. However, this could easily be reversed. As a result, it is also possible to describe a first bias direction 310 and a second bias direction 360, rather than positive and negative values.

Referring to both FIGS. 4 and 6, a current pulse may be applied in the first bias direction 310, resulting in the current-voltage response of the device 320 (loops 1-7), showing a controlled impedance decrease 220. In loop 1, for example, the current pulse applied achieves an absolute value peak current 330 of about 0.8 mA, where an impedance decrease 220 begins to occur. The current-voltage curve 320 then returns to zero along a somewhat offset line indicating the programmable impedance device 110 has transitioned to a lower tuned impedance value. If another current pulse is applied, for example yielding loop 2, the curve follows the tuned impedance value set from loop 1. However, for loop 2, an absolute value peak current 330 of about 1.1 mA is applied before the current is reduced back to zero. This higher absolute value peak current 330 causes an additional impedance decrease 220. As the current is reduced, loop 2 follows a new lower-tuned impedance.

The pulses used in reducing the impedance value are referred to as current pulses. They are described this way because the detection of peak current value 330 is a good indication of the impedance transition amplitude. Additionally, a successively higher current is required for each impedance decrease 220, making management and control of the tuned device impedance straightforward.

To increase the impedance of the programmable impedance device 110, voltage pulses are applied in a second, opposite bias direction 360. Resulting current-voltage curves 321 are shown as loops 8-17. The controlled voltage pulses may be used in the second bias direction 360 (loops 8-17) to control the point at which a impedance increase 240 occurs and control the magnitude of the impedance increase 240. In loop 8, for example, the voltage pulse applied achieves an absolute value peak voltage 331 of about −0.8 volts, where a impedance increase 240 begins to occur. The current-voltage curve 321 then returns to zero along a somewhat offset line indicating the programmable impedance device 110 has transitioned to a higher tuned impedance value. If another voltage pulse is applied, for example yielding loop 9, the curve follows the tuned impedance value set from loop 8. However, for loop 9, an absolute value peak voltage 331 of about 0.9 volts is applied before the voltage is reduced back to zero. This additional absolute value peak voltage 330 causes an additional impedance increase 240. As the voltage is reduced, loop 9 follows a new higher tuned impedance value.

The pulses in this second bias direction 360 are described as voltage pulses because the detection of peak voltage values is a good indication of the impedance transition amplitude. Additionally, a successively higher voltage is required for each distinct impedance increase 240, making management and control of the absolute value peak voltage 331 straightforward.

Figure 7:
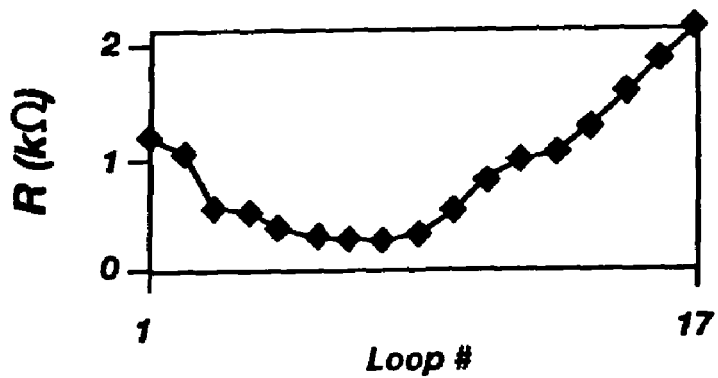
FIG. 7 is a graphic illustration depicting various impedance values obtained in the tuning process shown in FIG. 6.

FIG. 7 is a graph of the tuned impedance value of the programmable impedance device 110 after each of loops 1 through 17.

While, in this example, the pulses in the first bias direction 310 are referred to as current pulses and the pulses in the second bias direction 360 are referred to as voltage pulses, dependant upon device and power grounding configurations, these pulses may be reversed. These pulses applying current in the first bias direction 310 and voltage in the second bias direction 360 are indicative of one method to tune the programmable impedance devices 110. However, with alternate programmable materials 140 and alternate materials for the pair of electrodes (120 and 130), the impedance transitions 220, 240 may occur in a fashion such that either voltage or current or a mathematical combination of the two, such as electrical power (P=V*I), may best indicate a transition in the first bias direction 310. Similarly, either voltage or current or a mathematical combination of the two may best indicate a transition in the second bias direction 360.

Tuning to a specific impedance value may include any number and combination of applied pulses, using either voltage or current indicators in the first bias direction 310 and the second bias direction 360. As an arbitrary example, a loop in the first bias direction 310 may reduce the impedance to a value of about 800 ohms. An additional loop in the first bias direction 310 may be applied to further reduce the value to about 500 ohms. Then, a loop in the second bias direction 360 may be applied increasing the impedance to about 700 ohms. Finally, a loop in the first bias direction 310 may be applied to reduce the impedance to about 600 ohms.

The non-volatile programmable impedance behavior is stable, yet reconfigurable. At some later time, when a different impedance value is desired, perhaps after operational use in one configuration, the tuning process may be repeated to set the programmable impedance device 110 to a different impedance value in another configuration. In one tested embodiment, the non-volatile programmable impedance devices remained stable to within 0.5% over 2.5 years.

A non-volatile programmable impedance device can be used in electronic circuits for a variety of functions. It may be used, for example, in memory functions, impedance matching, defect detection configurations, and functional programming including de-multiplexing. Additionally, the reconfigurable nature of the present invention can be a key enabling element for defect-tolerant configurable-computer architectures, which is an element of most proposals for nanometer-scale electronics including molecular electronics.

The present invention may be used in a variety of analog and digital electronics applications, such as, for example, configuration bits for logic, impedance tuning for high speed logic & memory, impedance tuning for tight tolerance memory, impedance tuning for analog circuitry, and logical multi-level memory.

Figure 8:
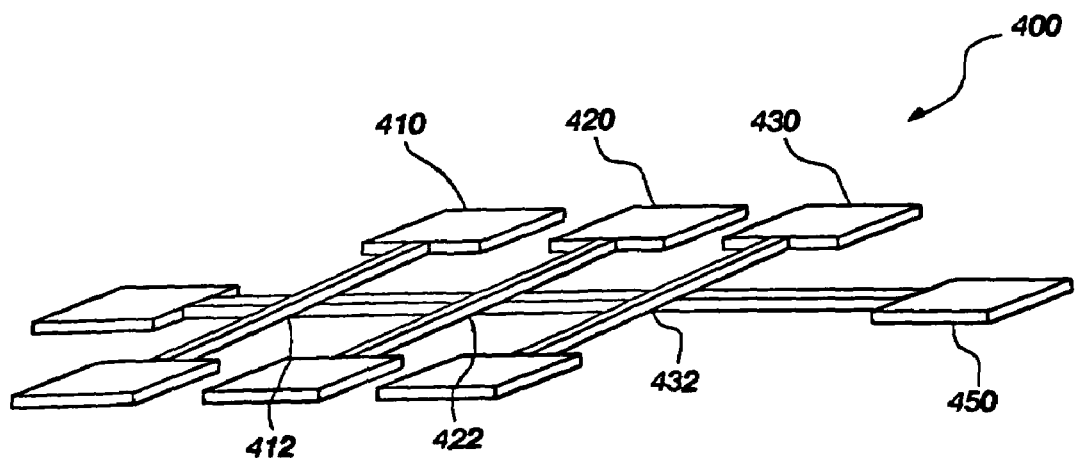
FIG. 8 is a three-dimensional view of a plurality of programmable impedance devices arranged to implement an exemplary application of the present invention.

By way of example only, a digital application is described in FIG. 8, which shows a three-dimensional view of a plurality of programmable impedance devices 110 arranged to implement an exemplary logic gate as a 1×3 crossbar using the programmable impedance devices 110 of the present invention. Three input nodes formed as second electrodes 130 cross an output node 450 formed as a first electrode 120 to form a programmable logic gate 400 comprised of three programmable impedance devices 110. A first node 410 crosses the output node 450 to form a first tunable resistor 412 at the junction between the first node 410 and the output node 450. A second node 420 crosses the output node 450 to form a second tunable resistor 422 at the junction between the second node 420 and the output node 450. A third node 430 crosses the output node 450 to form a third tunable resistor 432 at the junction between the third node 430 and the output node 450.

The programmable logic gate 400 may also be configured with the output node 450 as the second electrode 130 crossing the input nodes formed as first electrodes 120. It will be clear to a person of ordinary skill in the art that other complex configurations are possible. Also, additional circuitry, for example, diodes, may be combined with the programmable logic gate.

Figure 9:
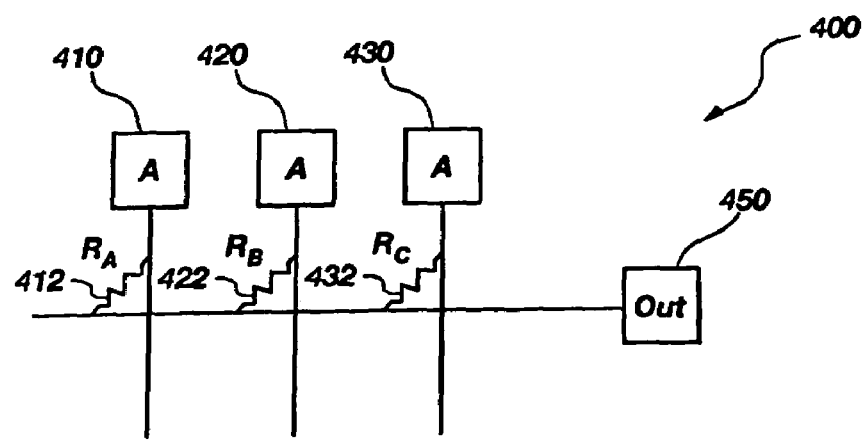
FIG. 9 is a schematic representation of the exemplary application of FIG. 8.

FIG. 9 shows a schematic version of the resulting circuit. In operation, the programmable logic gate 400 is a network of linear or non-linear resistors wherein each resistor may be independently tuned to a desired value using the tuning process described above. For example, the first tunable resistor 412 may be tuned to about 1 kilo-Ohms (kΩ), the second tunable resistor 422 may be tuned to about 2 kΩ and the third tunable resistor 432 may be tuned to about 4 kΩ.

Figure 10:
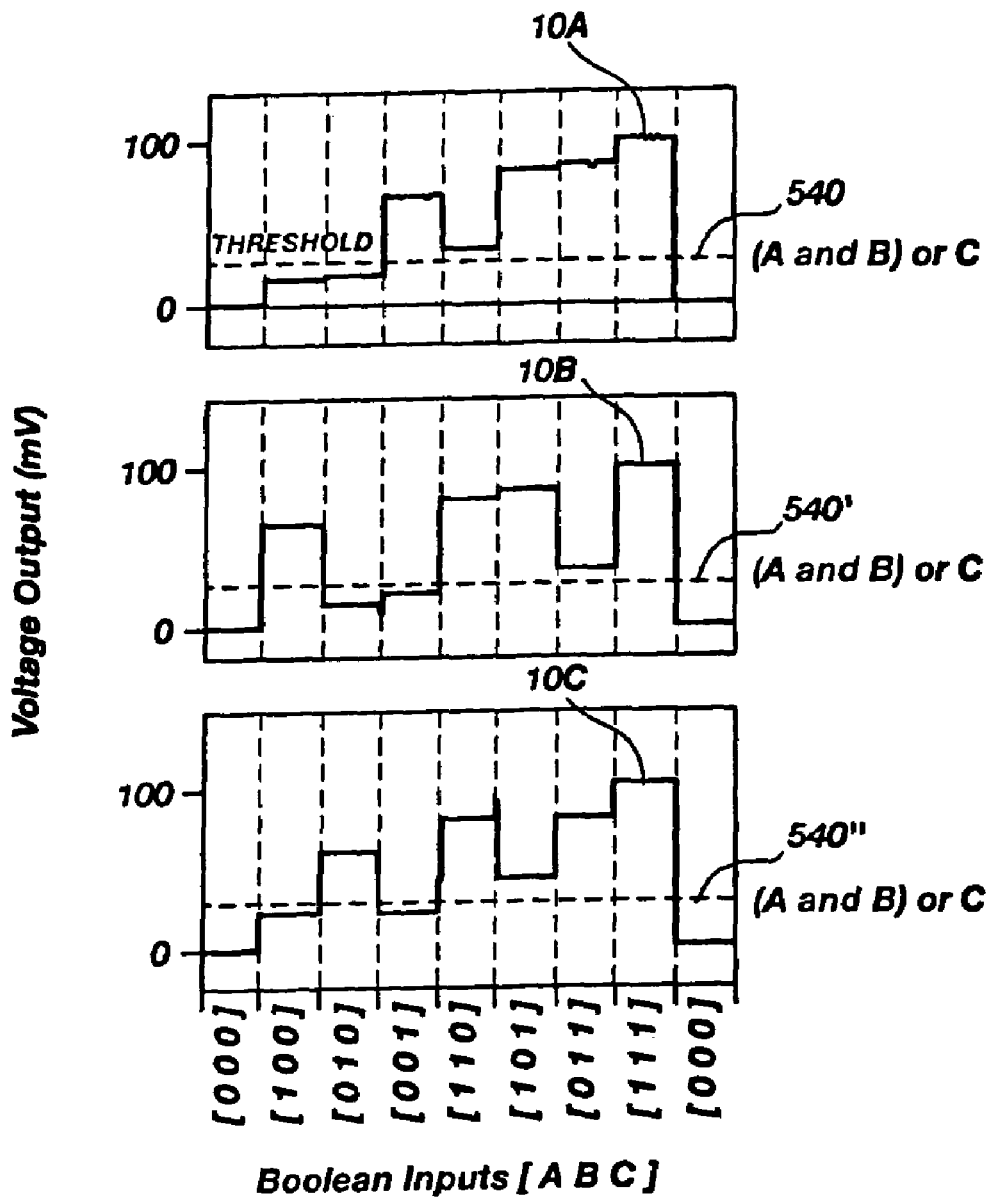
FIG. 10 is a waveform diagram illustrating voltage output from practicing the exemplary application of FIG. 8.

By programming the tunable resistor values to various resistances and sampling the output node 450 at a defined threshold voltage 540, the resulting programmable logic gate 400, shown in FIGS. 8 and 9, may be programmed to represent many logic combinations involving three or fewer inputs. FIG. 10 shows three exemplary programmed configurations and their voltage waveforms depicting a resulting voltage on the output node 450. Waveform 10A shows the output voltage for a logic equation of [(A AND B) OR C]. Waveform 10B shows the output voltage for a logic equation of [A OR (B AND C)]. Waveform 10C shows the output voltage for a logic equation of [(A AND C) OR B].

To illustrate operation of the programmable logic gate 400, waveform 10A is described in detail. The logic function [(A AND B) OR C] may be implemented by tuning the input resistors (412, 422, and 432) to a ratio of about $R_A:R_B:R_C=2:2:1$. In operation of the programmable logic gate 400, each of the input nodes may be driven to about 100 mV to indicate a logical 1 or to about 0 mV to indicate a logical 0.

Considering the Boolean input [ABC]=[100] for waveform 10A, the result is a relatively low voltage on the output node 450, which is interpreted as a logical 0.

On the other hand, considering the Boolean input [ABC]=[101] for waveform 10A, the result is a relatively high voltage on the output node 450, which is interpreted as a logical 1.

In these examples in FIG. 10, by choosing a threshold voltage 540 of about 30 mV, voltages on the output node 450 above the threshold voltage 540 may be considered a logical 1, while voltages on the output node 450 below the threshold voltage 540 may be considered a logical 0.

Because the impedance values of the input resistors (412, 422, and 432) are tunable, the same circuit of FIGS. 8 and 9 may be reconfigured to produce the three different logic waveforms shown in FIG. 10. As stated above, waveform 10A is a representation of the logic function [(A AND B) OR C], wherein the input resistors (412, 422, and 432) may be tuned to a ratio of about $R_A:R_B:R_C=2:2:1$. Waveform 10B is a representation of the logic function [(A OR (B AND C)], wherein the input resistors (412, 422, and 432) may be tuned to a ratio of about $R_A:R_B:R_C=1:2:2$. Waveform 10C is a representation of the logic function [(A AND C) OR B)], wherein the input resistors (412, 422, and 432) may be tuned to a ratio of about $R_A:R_B:R_C=2:1:2$.

Clearly, the input values of about 100 mV or 0 mV and the threshold voltage 540 on the output node 450 of about 30 mV are application dependent. Other ratios of input impedance values and other input voltages may result in considering a different threshold voltage 540. In addition, the impedance values are referred to in relative terms because the impedance values will be application specific.

Figure 11:
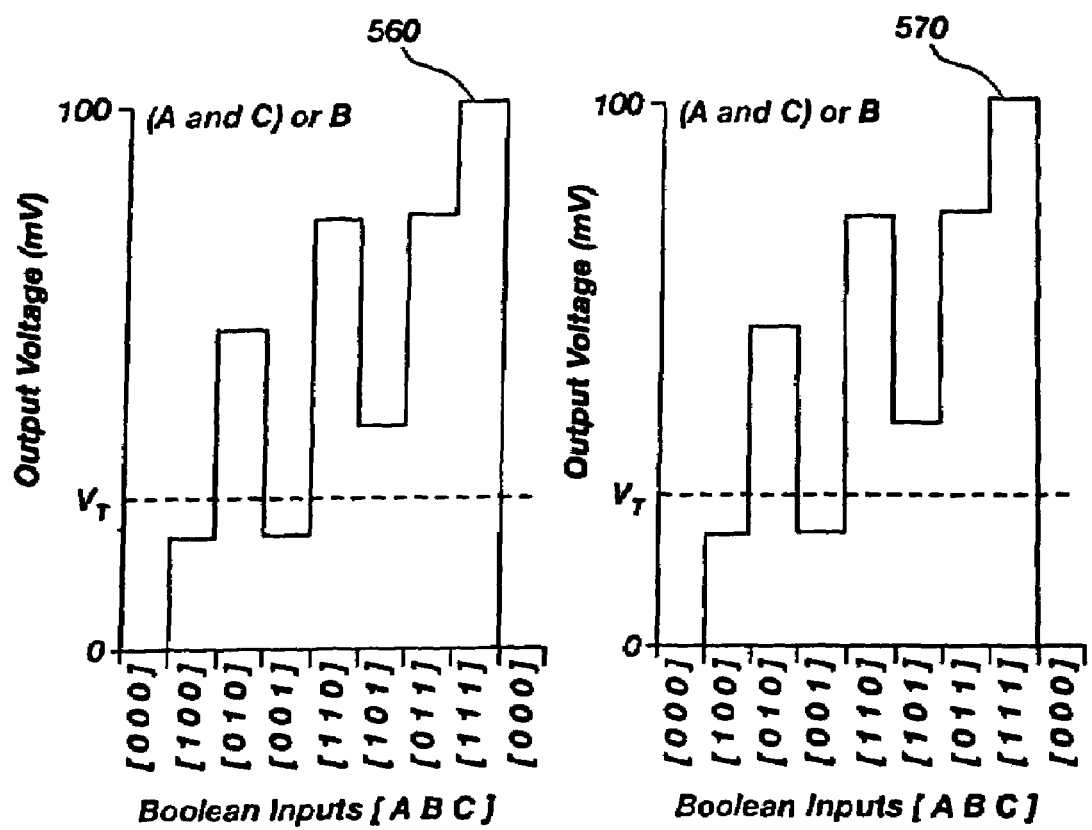
FIG. 11 is an exemplary illustration of the non-volatile nature of the programmable impedance devices.

FIG. 11 is an exemplary illustration of the non-volatile nature of the programmable impedance devices. Shown in FIG. 11 are the final waveform 10C from the exemplary application circuit of FIGS. 8, 9, 10 as first measured 560, and a second waveform of the same exemplary circuit re-measured 570 after an elapsed period of about 2.5 years. The difference between the first-measured 560 and re-measured 570 waveforms is less than about 0.5% at any point, indicating that all three exemplary programmable impedance devices in the circuit of FIG. 9 retained their programmed impedance states at a substantially constant value over this time period.

Although this invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. A programmable impedance device, comprising:
a first electrode;
a second electrode disposed to form a junction wherein the second electrode at least partially overlaps the first electrode; and
a programmable material of nanometer-scale thickness disposed between the first electrode and the second electrode at least at the junction, the programmable material operably coupling the first electrode and the second electrode such that the programmable impedance device exhibits a non-volatile programmable impedance that is tunable through a continuum of impedance values between and including a low impedance state and a high impedance state using a first bias direction to decrease the impedance and a second bias direction to increase the impedance.

2. The device of claim 1, wherein the programmable material further comprises a first interface element formed adjacent to the first electrode and the programmable material.

3. The device of claim 2, wherein the programmable material further comprises a second interface element formed adjacent to the second electrode and the programmable material.

4. The device of claim 1, wherein the programmable material further comprises a first interface element disposed between the second electrode and the programmable material.

5. The device of claim 1, wherein the non-volatile programmable impedance may be reconfigurably decreased by the application of voltage, current, or voltage and current with sufficient magnitude and sign, between the first electrode and the second electrode.

6. The device of claim 1, wherein the non-volatile programmable impedance may be reconfigurably increased or reconfigurably decreased by the application of voltage, current, or voltage and current with sufficient magnitude and sign, between the first electrode and the second electrode.

7. The device of claim 1, wherein the first electrode comprises a material selected from the group consisting of tantalum, titanium, platinum, aluminum, silicon, and tungsten.

8. The device of claim 1, wherein the second electrode comprises a material selected from the group consisting of tantalum, titanium, aluminum, chromium, and platinum.

9. The device of claim 1, wherein the programmable material is selected from the group consisting of titanium oxide, platinum oxide, tantalum oxide, eicosanoic acid, stearic acid, poly (methyl methacrylate), fast-blue, chlorophyll-B, and tantalum oxide.

10. The device of claim 1, wherein the programmable material comprises a monolayer.

11. The device of claim 1, wherein the programmable material comprises a plurality of monolayers.

12. The device of claim 1, wherein the programmable material comprises an organic material.

13. The device of claim 12, wherein the programmable material is selected from the group consisting of eicosanoic acid, stearic acid, poly (methyl methacrylate), fast-blue, and chlorophyll-B.

14. The device of claim 1, wherein the device is disposed on a substrate, the substrate including at least one conventional device selected from the group consisting of electronic devices, optical devices, mechanical devices, and combinations thereof.

15. The device of claim 1, wherein the programmable material includes a material is selected from the group consisting of oxides of titanium, oxides of platinum, oxides of tantalum, and carbides of titanium.

16. A programmable impedance device, comprising:
a first electrode;
a second electrode disposed to form a junction wherein the second electrode at least partially overlaps the first electrode; and
a programmable material disposed between the first electrode and the second electrode at least at the junction, the programmable material operably coupling the first electrode and the second electrode such that the programmable impedance device exhibits a non-volatile programmable impedance that is tunable through a continuum of impedance values between and including a low impedance state and a high impedance state using a first bias direction to decrease the impedance and a second bias direction to increase the impedance, wherein the programmable material comprises an inorganic material.

17. The device of claim 16, wherein the junction comprises at least one dimension in micrometers.

18. The device of claim 16, wherein the junction comprises at least one dimension in nanometers.

19. The device of claim 16, wherein the programmable material further comprises a first interface element formed adjacent to the first electrode and the programmable material.

20. The device of claim 19, wherein the programmable material further comprises a second interface element formed adjacent to the second electrode and the programmable material.

21. The device of claim 16, wherein the programmable material further comprises a first interface element disposed between the second electrode and the programmable material.

22. The device of claim 16, wherein the non-volatile programmable impedance may be reconfigurably decreased by the application of voltage, current, or voltage and current with sufficient magnitude and sign, between the first electrode and the second electrode.

23. The device of claim 16, wherein the non-volatile programmable impedance may be reconfigurably increased or reconfigurably decreased by the application of voltage, current, or voltage and current with sufficient magnitude and sign, between the first electrode and the second electrode.

24. The device of claim 16, wherein the first electrode comprises a material selected from the group consisting of tantalum, titanium, platinum, aluminum, silicon, and tungsten.

25. The device of claim 16, wherein the second electrode comprises a material selected from the group consisting of tantalum, titanium, aluminum, chromium, and platinum.

26. The device of claim 16, wherein the programmable material comprises a monolayer.

27. The device of claim 16, wherein the programmable material comprises a plurality of monolayers.

28. The device of claim 16, wherein the device is disposed on a substrate, the substrate including at least one conventional device selected from the group consisting of electronic devices, optical devices, mechanical devices, and combinations thereof.

29. The device of claim 16, wherein the programmable material includes a material selected from the group consisting of oxides of titanium, oxides of platinum, oxides of tantalum, and carbides of titanium.

30. A programmable impedance device, comprising:

a first electrode;

a second electrode disposed to form a junction wherein the second electrode at least partially overlaps the first electrode; and a programmable material disposed between the first electrode and the second electrode at least at the junction, the programmable material operably coupling the first electrode and the second electrode such that the programmable impedance device exhibits a non-volatile programmable impedance that is tunable through a continuum of impedance values between and including a low impedance state and a high impedance state using a first bias direction to decrease the impedance and a second bias direction to increase the impedance, wherein the non-volatile programmable impedance is substantially constant for at least 2.5 years.

* * * * *

(12) EX PARTE REEXAMINATION CERTIFICATE (8886th)
United States Patent
Stewart et al.

(10) Number: US 7,443,711 C1
(45) Certificate Issued: Mar. 6, 2012

(54) NON-VOLATILE PROGRAMMABLE IMPEDANCE NANOSCALE DEVICES

(75) Inventors: Duncan R. Stewart, Menlo Park, CA (US); Patricia A. Beck, Palo Alto, CA (US); Douglas A. Ohlberg, Mountain View, CA (US)

(73) Assignee: Hewlett-Packard Development Company, L.P., Houston, TX (US)

Reexamination Request:
No. 90/009,633, Nov. 9, 2009

Reexamination Certificate for:
Patent No.: 7,443,711
Issued: Oct. 28, 2008
Appl. No.: 11/014,554
Filed: Dec. 16, 2004

(51) Int. Cl.
*G11C 11/56* (2006.01)
*H01L 23/58* (2006.01)

(52) U.S. Cl. ................ 365/148; 257/2; 257/5
(58) Field of Classification Search .......... 257/148
See application file for complete search history.

(56) References Cited

To view the complete listing of prior art documents cited during the proceeding for Reexamination Control Number 90/009,633, please refer to the USPTO's public Patent Application Information Retrieval (PAIR) system under the Display References tab.

*Primary Examiner*—Tuan H. Nguyen

(57) ABSTRACT

Programmable impedance devices and methods of fabricating the devices are disclosed. The programmable impedance devices exhibit non-volatile tunable impedance properties. A programmable impedance device includes a first electrode, a second electrode and a programmable material disposed between the two electrodes. The programmable material may be disposed at a junction between the first and second electrodes.

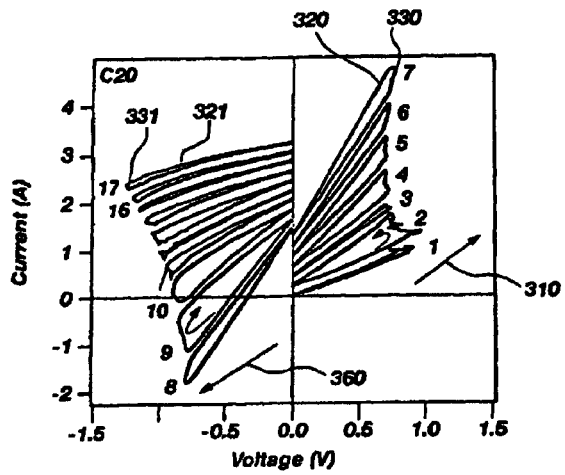
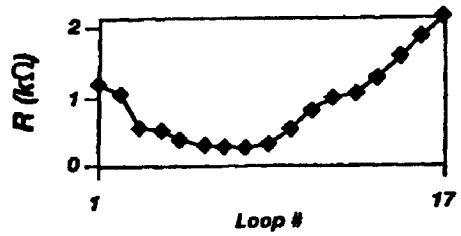

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claim 30 is confirmed.

Claims 1-4, 16 and 19-21 are determined to be patentable as amended.

Claims 5-15, 17, 18 and 22-29, dependent on an amended claim, are determined to be patentable.

1. A programmable impedance device, comprising:
a first electrode;
a second electrode disposed to form a junction wherein the second electrode at least partially overlaps the first electrode; [and]
a programmable material of nanometer-scale thickness disposed between the first electrode and the second electrode at least at the junction; *and*
a first interface element composed of a single material [and] formed between one of the electrodes and the programmable material, the [programmable material including at least one] *first interface element fills the space between the electrode and the programmable material to form a* tunnel barrier between [at least one of the electrodes] *the electrode* and the programmable material, the programmable material operably coupling the first electrode and the second electrode such that the programmable impedance device exhibits a non-volatile programmable impedance that is tunable through a continuum of impedance values between and including a low impedance state and a high impedance state using a first bias direction to decrease the impedance and a second bias direction to increase the impedance.

2. The device of claim 1, wherein the first interface element is formed between the first electrode and the programmable material[, the first interface element forming the tunnel barrier between the first electrode and the programmable material].

3. The device of claim 2, further comprising a second interface element composed of a single material [and] formed between the second electrode and the programmable material, the second interface element [forming the ] *fills the space between the second electrode and the programmable material to form a* tunnel barrier between the second electrode and the programmable material.

4. The device of claim 1, wherein the first interface element is formed between the second electrode and the programmable material[, the first interface element forming the tunnel barrier between the second electrode and the programmable material].

16. A programmable impedance device, comprising:
a first electrode;
a second electrode disposed to form a junction wherein the second electrode at least partially overlaps the first electrode;
a programmable material disposed between the first electrode and the second electrode at least at the junction; and
a first interface element composed of a single material [and] formed between one of the electrodes and the programmable material, the [programmable material including at least one] *first interface element fills the space between the electrode and the programmable material to form a* tunnel barrier between [at least one of the electrodes] *the electrode* and the programmable material, the programmable material operably coupling the first electrode and the second electrode such that the programmable impedance device exhibits a non-volatile programmable impedance that is tunable through a continuum of impedance values between and including a low impedance state and a high impedance state using a first bias direction to decrease the impedance and a second bias direction to increase the impedance, wherein the programmable material comprises an inorganic material.

19. The device of claim 16, wherein the first interface element is formed between the first electrode and the programmable material[, the first interface element forming the tunnel barrier between the first electrode and the programmable material].

20. The device of claim 19, further comprising a second interface element composed of a single material [and] formed between the second electrode and the programmable material, the second interface element [forming the ] *fills the space between the second electrode and the programmable material to form a* tunnel barrier between the second electrode and the programmable material.

21. The device of claim 16, wherein the first interface element is formed between the second electrode and the programmable material[, the first interface element forming the tunnel barrier between the second electrode and the programmable material].

\* \* \* \* \*